(12) United States Patent
Lee et al.

(10) Patent No.: US 11,353,193 B2
(45) Date of Patent: Jun. 7, 2022

(54) LIGHTING MODULE AND LIGHTING DEVICE COMPRISING SAME

(71) Applicant: LG INNOTEK CO., LTD., Seoul (KR)

(72) Inventors: Dong Hyun Lee, Seoul (KR); Jung Ho Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/284,512

(22) PCT Filed: Oct. 15, 2019

(86) PCT No.: PCT/KR2019/013471
§ 371 (c)(1),
(2) Date: Apr. 12, 2021

(87) PCT Pub. No.: WO2020/085703
PCT Pub. Date: Apr. 30, 2020

(65) Prior Publication Data
US 2021/0372594 A1    Dec. 2, 2021

(30) Foreign Application Priority Data
Oct. 24, 2018  (KR) .......................... 10-2018-0127686

(51) Int. Cl.
*F21V 8/00* (2006.01)
*G02F 1/13357* (2006.01)
(Continued)

(52) U.S. Cl.
CPC ................ *F21V 11/08* (2013.01); *F21V 5/00* (2013.01); *F21V 7/05* (2013.01); *G02B 6/0036* (2013.01);
(Continued)

(58) Field of Classification Search
CPC ......... G02F 1/133605; G02F 1/133606; G02F 1/133609; G02F 1/133611; G02B 6/0036;
(Continued)

(56) References Cited

U.S. PATENT DOCUMENTS 8,541,801 B2    9/2013  Kim et al.
8,801,209 B2 *  8/2014  Im ..................... G02F 1/133603
                                                    362/249.02
(Continued)

FOREIGN PATENT DOCUMENTS

KR    10-2015-0006652    1/2015
KR       10-1817373      1/2018
(Continued)

OTHER PUBLICATIONS

International Search Report dated Feb. 4, 2020 issued in Application No. PCT/KR2019/013471.
(Continued)

*Primary Examiner* — Sean P Gramling
(74) *Attorney, Agent, or Firm* — KED & Associates, LLP

(57) ABSTRACT

A lighting module disclosed in an embodiment of the invention may comprise: a substrate; a reflective portion disposed on the substrate; a plurality of light emitting devices disposed on the substrate; a resin layer disposed on the reflective portion and the light emitting devices; and a diffusion layer disposed on the resin layer. The resin layer includes a light-blocking portion that is a recessed area formed to be concave on the upper surface of the resin layer, and the light emitting devices emit light in a first direction, wherein the light-blocking portion may comprise: a first region overlapping the light emitting devices; a second region extending in the first direction from the first region; a third region extending from the second region in the direction of a first side of the substrate; and a fourth region
(Continued)

extending from the second region in the direction of a second side of the substrate. The surface area of the second region may be larger than that of the third region or that of the fourth region, and the light-blocking portion may be formed as an air gap.

20 Claims, 10 Drawing Sheets

(51) Int. Cl.
  *F21V 11/08* (2006.01)
  *F21V 5/00* (2018.01)
  *F21V 7/05* (2006.01)
  *F21Y 115/10* (2016.01)

(52) U.S. Cl.
  CPC ......... *G02B 6/0038* (2013.01); *G02B 6/0051* (2013.01); *G02F 1/133603* (2013.01); *G02F 1/133605* (2013.01); *G02F 1/133606* (2013.01); *G02F 1/133611* (2013.01); *F21Y 2115/10* (2016.08)

(58) Field of Classification Search
  CPC .... G02B 6/0038; G02B 6/004; G02B 6/0043; G02B 6/0051
  See application file for complete search history.

(56) References Cited

U.S. PATENT DOCUMENTS

| | | |
|---|---|---|
| 9,097,831 B2 | 8/2015 | Yagi et al. |
| 2007/0121340 A1* | 5/2007 | Hoshi .................. G02B 6/0021 362/600 |
| 2008/0061307 A1 | 3/2008 | Ikeda et al. |
| 2011/0050558 A1 | 3/2011 | Park et al. |
| 2011/0051397 A1 | 3/2011 | Bae et al. |
| 2013/0328090 A1 | 12/2013 | Park et al. |
| 2014/0159076 A1 | 6/2014 | Sota et al. |
| 2015/0124484 A1* | 5/2015 | Gu ....................... G02B 6/0021 362/613 |
| 2019/0137046 A1 | 5/2019 | Hwang et al. |

FOREIGN PATENT DOCUMENTS

| | | |
|---|---|---|
| WO | WO 2010/077082 | 7/2010 |
| WO | WO 2017/191954 | 11/2017 |

OTHER PUBLICATIONS

European Search Report dated Dec. 9, 2021 issued in Application No. 19877506.6.

* cited by examiner

LIGHTING MODULE AND LIGHTING DEVICE COMPRISING SAME

CROSS-REFERENCE TO RELATED PATENT APPLICATIONS

This application is a U.S. National Stage Application under 35 U.S.C. § 371 of PCT Application No. PCT/KR2019/013471, filed Oct. 15, 2019, which claims priority to Korean Patent Application No. 10-2018-0127686, filed Oct. 24, 2018, whose entire disclosures are hereby incorporated by reference.

TECHNICAL FIELD

An embodiment of the invention relates to a lighting module having a light emitting device and providing a surface light source. Embodiments of the invention relate to a lighting device, a light unit, a liquid crystal display device, or a vehicle lamp having a lighting module.

BACKGROUND ART

Typical lighting applications include vehicle lights as well as backlights for displays and signs. Light emitting device, such as light emitting diode (LED), have advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. However, since an emission angle of light emitted from the light emitting diode is small, when the light emitting diode is used as a vehicle lamp, there is a demand for increasing the light emitting area of the lamp using the light emitting diode. Since the light emitting diode is small, it may increase the design freedom of the lamp, and it is economical due to its semi-permanent life.

DISCLOSURE

Technical Problem

An embodiment of the invention provides a lighting module in which a light-blocking portion is disposed at a resin layer covering a light emitting device. An embodiment of the invention provides a lighting module having a light-blocking portion formed of an air gap in a region lower than an upper surface of the resin layer. An embodiment of the invention provides a lighting module in which a light-blocking portion disposed in an intaglio-shaped recess is disposed between a resin layer and a diffusion layer on a light emitting device. An embodiment of the invention provides a lighting module including a light-blocking portion having a non-contact region with the diffusion layer between a region contacted with the diffusion layer on an upper surface of a resin layer.
An embodiment of the invention provides a lighting module in which a reflective member is disposed between a resin layer and a substrate. An embodiment of the invention provides a lighting module for irradiating a surface light source and a lighting device having the same. An embodiment of the invention may provide a backlight unit having an illumination module, a liquid crystal display device, or a vehicle lamp.

Technical Solution

A lighting module according to an embodiment of the invention includes a substrate; a reflective member disposed on the substrate; a plurality of light emitting devices disposed on the substrate; a resin layer disposed on the reflective member and the light emitting device; and a diffusion layer disposed on the resin layer, wherein the resin layer includes a light-blocking portion that is a recess region formed concave from an upper surface of the resin layer, and the light emitting device emits light in a first direction, and the light-blocking portion includes a first region overlapping the light emitting device, a second region extending in the first direction from the first region, a third region extending from the second region in a direction of a first side surface of the substrate, and a fourth region extending from the second region in a direction of a second side surface of the substrate, wherein an area of the second region is larger than an area of the third region or an area of the fourth region, and the light-blocking portion may be formed as an air gap.

According to an embodiment of the invention, the second region, the third region, and the fourth region of the light-blocking portion may include curved surfaces that are convex in an outward direction. The area of the first region is at least ½ of an upper surface area of the light emitting device, the light emitting device includes an emission surface that emits light in the first direction, and the emission surface may be disposed perpendicular to an upper surface of the substrate. A plurality of light emitting devices are disposed on the substrate in the first direction, and a plurality of light-blocking portions are disposed on the resin layer in the first direction, and the maximum length of the light-blocking portion in the first direction may be smaller than the maximum width in the second direction orthogonal to the first direction. An inner side surface of the resin layer forming the light-blocking portion is vertically overlapped with the light emitting device and is flat, and the width of the inner side surface of the flat resin layer in the second direction may be greater than the width in the second direction of the light emitting device. A bottom surface of the resin layer on which the light-blocking portion is formed is flat, and a depth of the light-blocking portion may range from 0.05 times to 0.1 times a thickness of the resin layer. The light-blocking portion is disposed in a region on the resin layer that deviates from a predetermined angle from a horizontal straight line on the upper surface of the light emitting device, and the angle may be less than 10 degrees. The bottom surface of the resin layer on which the light-blocking portion is formed may have an adhesive force lower than that of a surface in which the diffusion layer and the resin layer contact each other.

According to an embodiment of the invention, the reflective member includes a plurality of first open regions disposed adjacent to the first side surface of the substrate, and a plurality of second open regions disposed adjacent to the second side surface of the substrate, wherein each of the plurality of first open regions and the second open regions is arranged in the first direction, and the resin layer may include protrusions disposed in each of the first and second open regions. A distance between the first and second open region is smaller than the maximum width of the light-blocking portion in the second direction, and the first and second open regions may be disposed so as not to overlap the light emitting device in the first and second directions. According to an embodiment of the invention, the light-blocking portion may be vertically overlapped with any one of the first open regions or any one of the second open regions.

Advantageous Effects

According to the lighting module according to the embodiment of the invention, it is possible to improve the brightness and light uniformity of the surface light source. According to an embodiment of the invention, by providing a light-blocking portion formed of an air gap in a resin layer disposed on a light emitting device, it is possible to prevent hot spots and reduce light loss. By attaching the diffusion layer using the adhesive force of the upper surface of the resin layer, a light-blocking portion or a total reflective surface may be provided through etching of the upper surface of the resin layer, and hot spots may be prevented and light uniformity may be improved. An embodiment of the invention may improve light reflection efficiency by providing a reflective member between the resin layer and the substrate. It is possible to improve the optical reliability of the lighting module and the lighting device having the same according to an embodiment of the invention. It may be applied to a vehicle lighting device, a backlight unit, various display devices, a surface light source lighting device, or a vehicle lamp having an lighting module according to an embodiment of the invention.

BEST MODE

Figure 1:
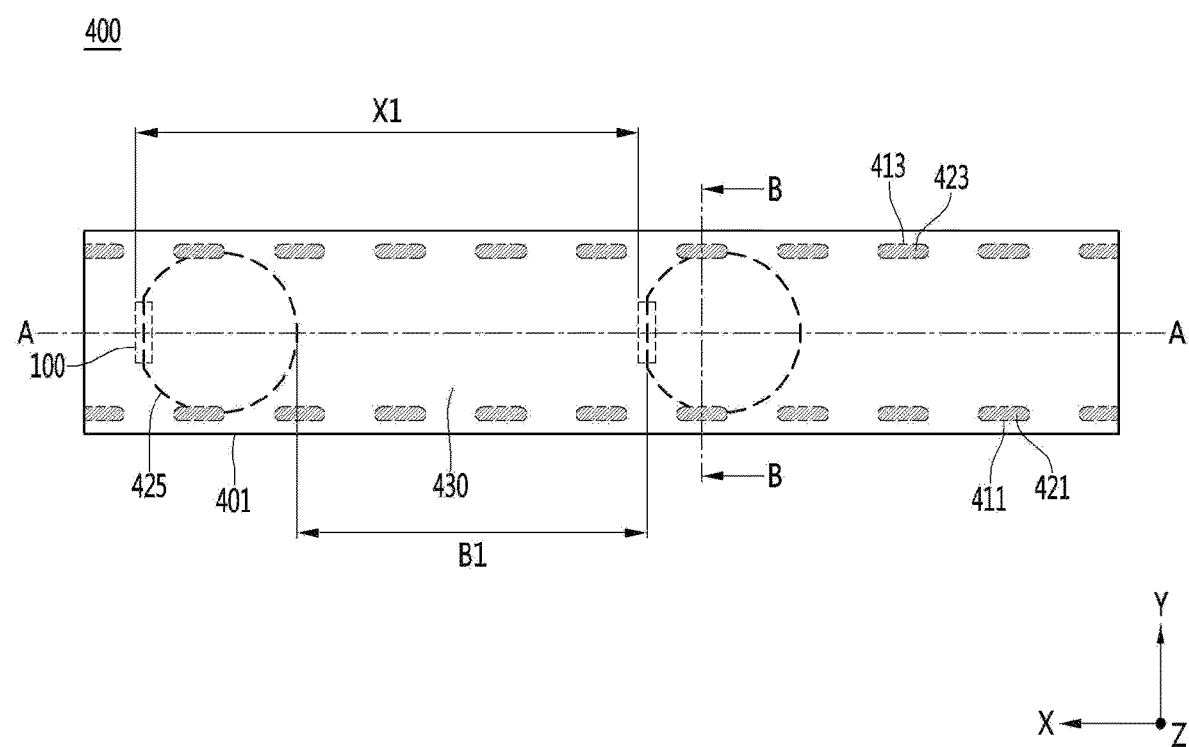
FIG. 1 is a plan view showing a lighting module according to an embodiment.

Hereinafter, preferred embodiments of the invention will be described in detail with reference to the accompanying drawings.

The technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

The lighting device according to the invention may be applied to a variety of lamp devices that require lighting, such as vehicle lamps, home lighting devices, or industrial lighting devices. For example, when applied to vehicle lamps, it is applicable to headlamps, sidelights, side mirrors, fog lights, tail lamps, brake lights, daytime running lights, vehicle interior lights, door scars, rear combination lamps, backup lamps, etc. The lighting device of the invention may be applied to indoor and outdoor advertising devices, display devices, and various electric vehicle fields, and in addition, it may be applied to all lighting-related fields or advertisement-related fields that are currently developed and commercialized or that may be implemented according to future technological developments.

Embodiment

Figure 2:
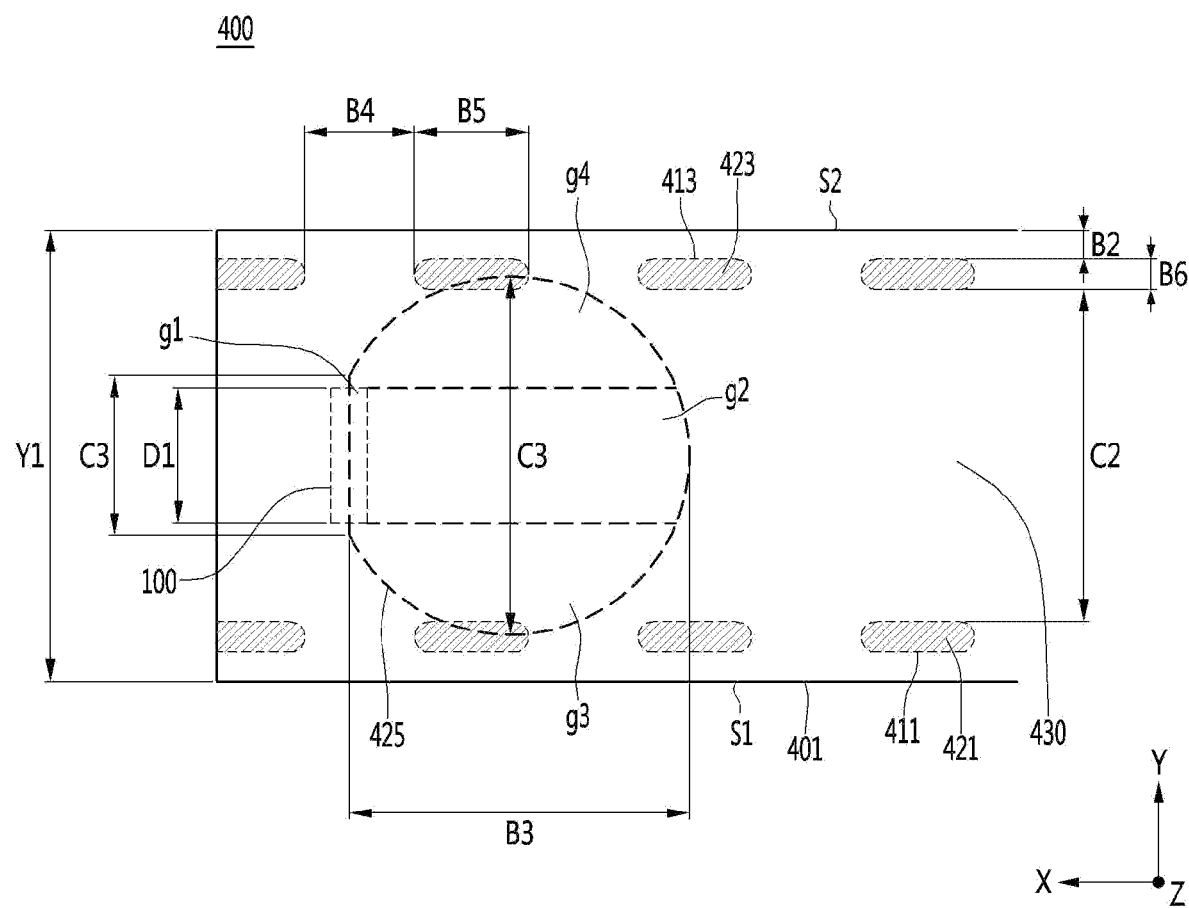
FIG. 2 is a partially enlarged view of the lighting module of FIG. 1.
Figure 3:
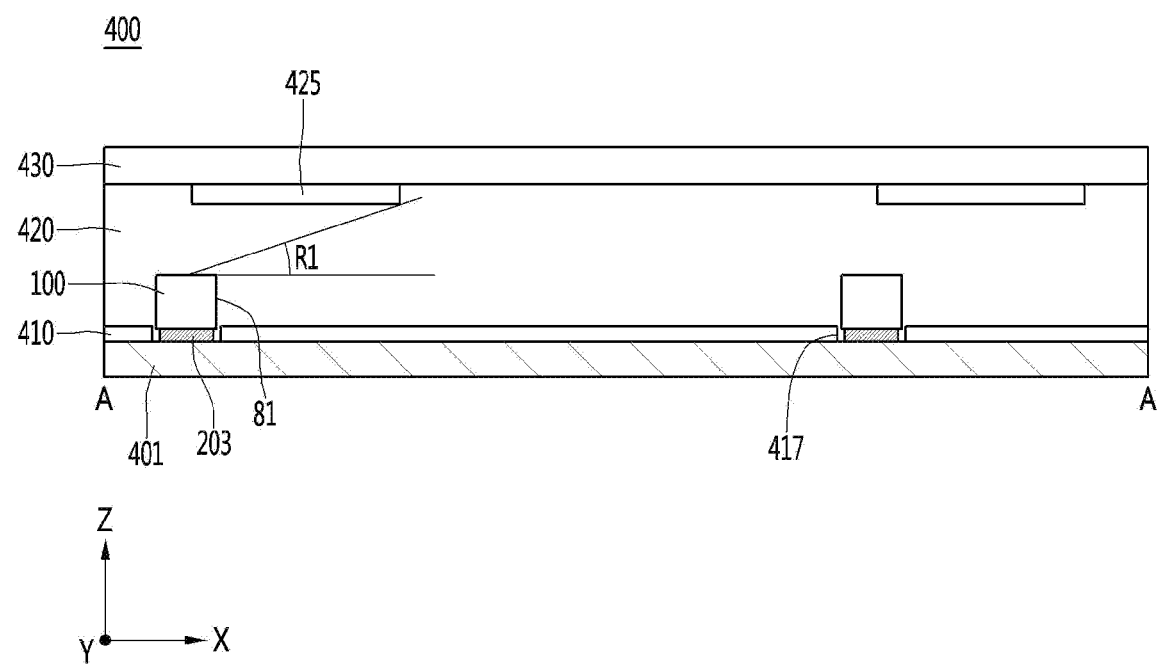
FIG. 3 is a cross-sectional view taken along line A-A of the lighting module of FIG. 1.
Figure 4:
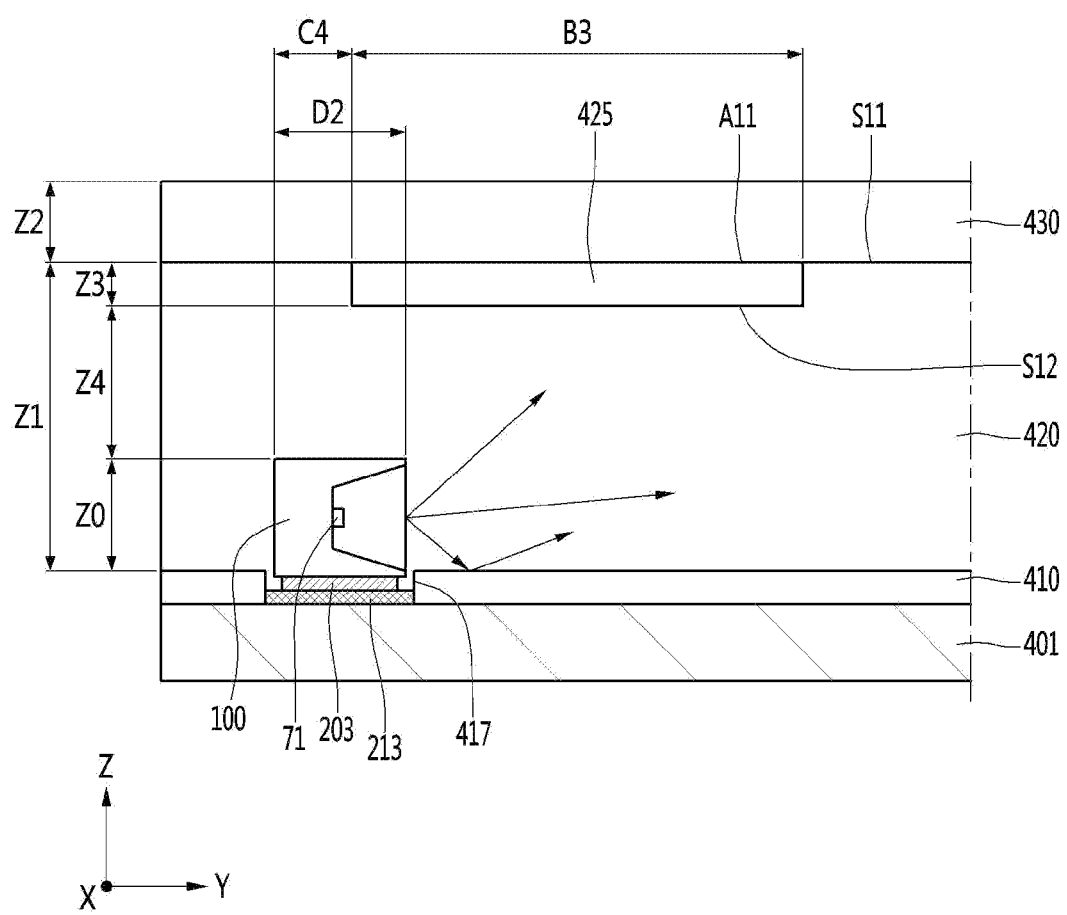
FIG. 4 is a partially enlarged view of the lighting module of FIG. 3.
Figure 5:
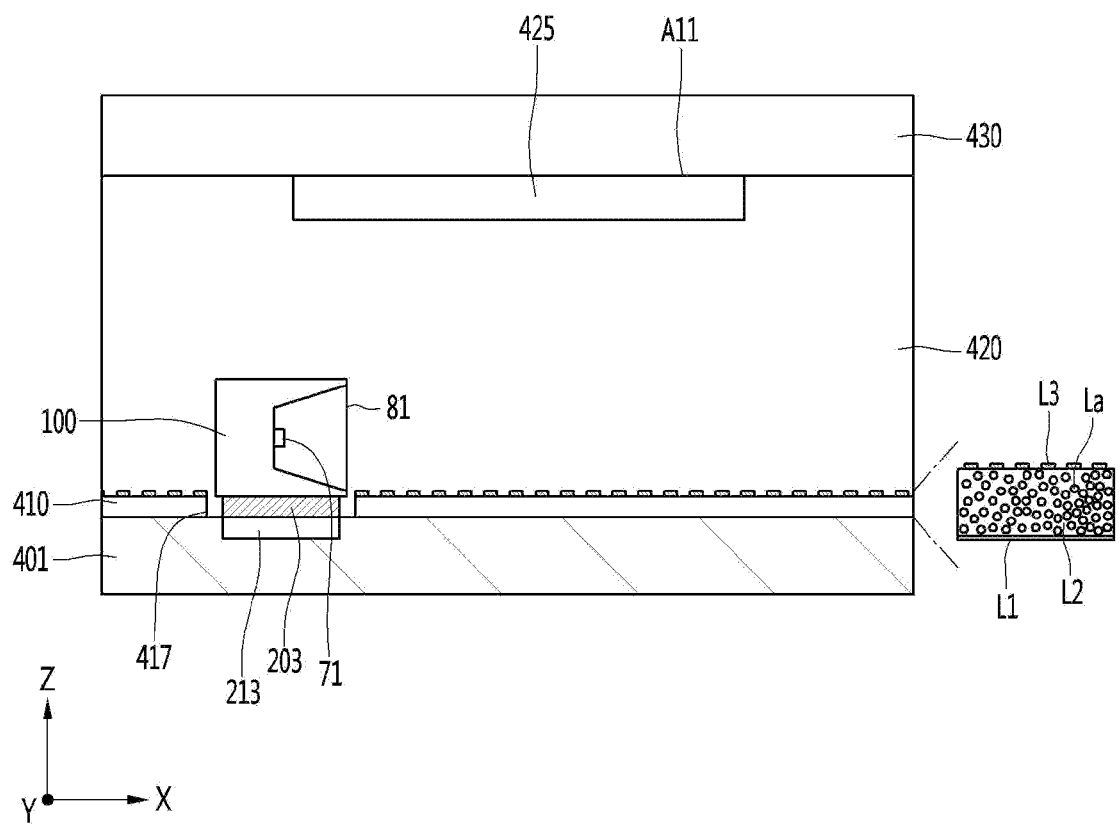
FIG. 5 is an enlarged view of a reflective member in the lighting module of FIG. 3.
Figure 6:
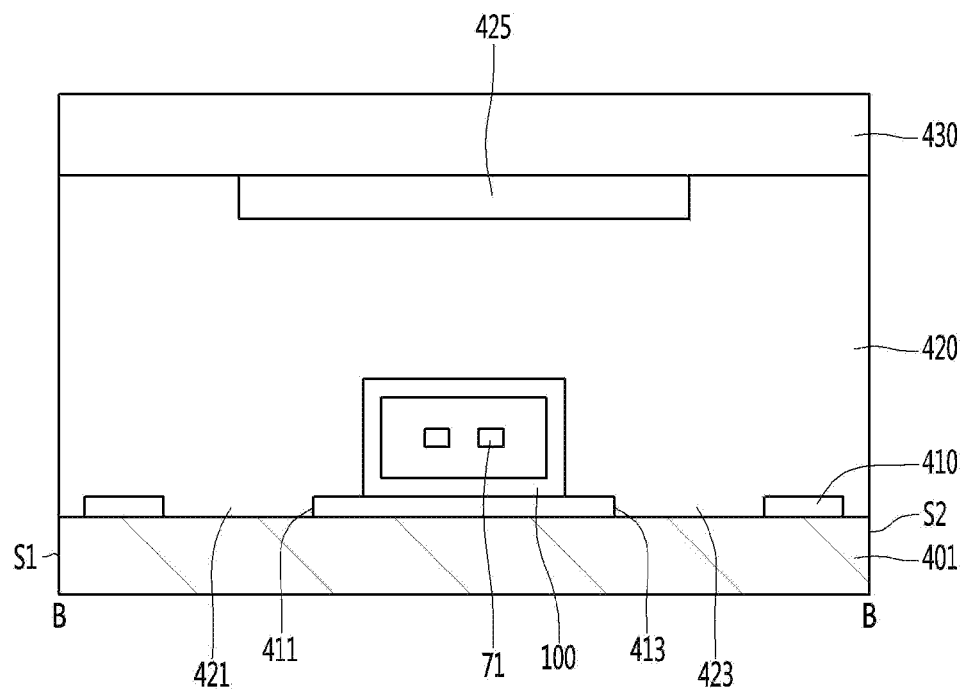
FIG. 6 is a cross-sectional view taken along line B-B of the lighting module of FIG. 1.

FIG. 1 is a plan view showing a lighting module according to an embodiment, FIG. 2 is a partial enlarged view of the lighting module of FIG. 1, FIG. 3 is a cross-sectional view taken along line A-A of the lighting module of FIG. 1, and FIG. 4 is the lighting module of FIG. FIG. 5 is an enlarged view of a reflective member in the lighting module of FIG. 3, and FIG. 6 is a cross-sectional view taken along line B-B of the lighting module of FIG. 1.

Referring to FIGS. 1 to 6, a lighting module 400 according to an embodiment of the invention may include a substrate 401, a light emitting device 100 disposed on the substrate 401, a resin layer 420 covering the substrate 401 and the light emitting devices 100, and a diffusion layer 430 on the resin layer 420. The lighting module 400 may include a reflective member 410 disposed on the substrate 401. The lighting module 400 according to an embodiment of the invention may emit light emitted from the light emitting device 100 to a surface light source. The lighting module 400 may be defined as a light emitting cell or a light source module. The lighting module 400 may include one light emitting cell or a plurality of light emitting cells on the substrate 401.

Substrate 401

Referring to FIGS. 1 to 3, the substrate 401 may include a printed circuit board (PCB). The substrate 401 may include, for example, at least one of a resin-based printed circuit board (PCB), a metal core PCB, a flexible PCB, a ceramic PCB, or an FR-4 substrate. Since the substrate 401 is disposed as a metal core PCB in which a metal layer is disposed on the bottom, heat dissipation efficiency of the light emitting device 100 may be improved. The substrate 401 may be electrically connected to the light emitting device 100. The substrate 401 includes a wiring layer (not shown) thereon, and the wiring layer may be electrically connected to the light emitting device 100. When the light emitting devices 100 are arranged in plural on the substrate 401, the plurality of light emitting devices 100 may be connected in series, parallel, or in series-parallel by the wiring layer. The substrate 401 may function as a base member or a support member disposed under the light emitting device 100 and the resin layer 420.

The upper surface of the substrate 401 may include an X-Y plane. The upper surface of the substrate 401 may be a flat plane or may include a curved surface. The thickness of the substrate 401 may be a height in a vertical direction or a Z direction. Here, a X direction may be a first direction, and a Y direction may be a second direction. The Z direction may be a direction orthogonal to the first and second directions. The length of the substrate 401 in the first direction may be greater than the width of the second direction. The length of the substrate 401 in the first direction may be twice or more, for example, 4 times or more than the width Y1 in the second direction. The plurality of light emitting devices 100 may be arranged on the substrate 401 with predetermined intervals in the first direction. The substrate 401 may include a light-transmitting material through which light is transmitted through an upper surface and a lower surface. The translucent material may include at least one of polyethylene terephthalate (PET), polystyrene (PS), and polyimide (PI).

Light Emitting Device 100

Figure 12:
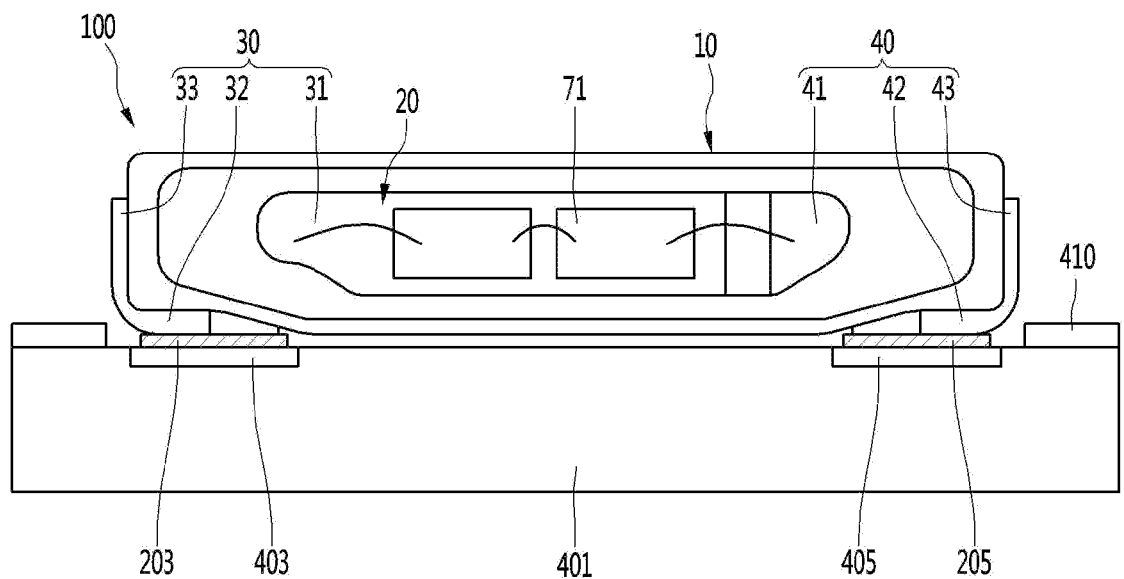
FIG. 12 is a front view of a light emitting device on a substrate in the lighting module of FIG. 6.
Figure 13:
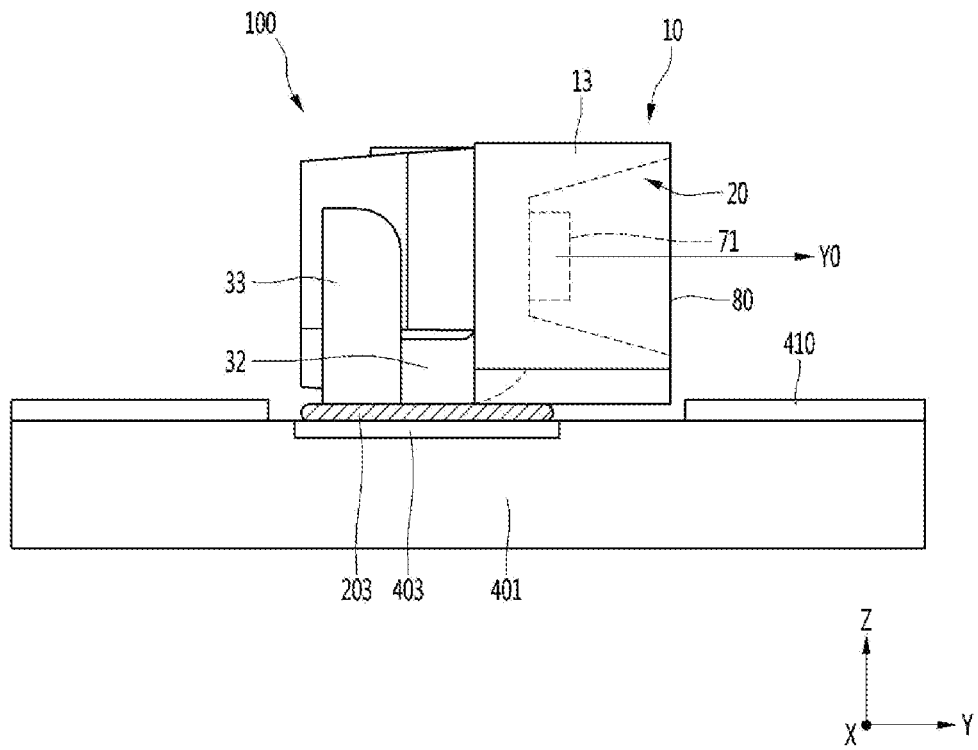
FIG. 13 is a side view of a light emitting device on a substrate in the lighting module of FIG. 3.

Referring to FIGS. 1 to 4, the light emitting device 100 is disposed on the substrate 401 and emits light in a first direction. The light emitting device 100 emits light having the highest intensity in the first direction. The light emitting device 100 includes an emission surface 81 from which light is emitted, and the emission surface 81 may be disposed in the third direction or in a vertical direction with respect to the horizontal upper surface of the substrate 401. The emission surface 81 may be a vertical plane, or may include a concave surface or a convex surface with respect to a vertical surface. As shown in FIGS. 12 and 13, the light emitting device 100 may be disposed on the substrate 401 and electrically connected to the pads 403 and 405 of the substrate 401 by conductive bonding members 203 and 205. The conductive bonding members 203 and 205 may be made of a solder material or a metal material. As another example, the light emitting devices 100 may be arranged in at least one row, or two or more rows on the substrate 401 in the second direction, and the light emitting devices 100 may be arranged in one or two or more rows and may be disposed in the first direction of the substrate 401 or may be disposed in different directions.

The light emitting device 100 may be arranged as a first light emitting device from one end of the substrate 401 and a second light emitting device in an emission direction of the first light emitting device. The first light emitting device and the second light emitting device irradiate light in a direction or the first direction of the other end of the substrate 401. That is, the first light emitting device irradiates light in a direction of the second light emitting device, and the second light emitting device irradiates light in a direction of the other end of the substrate 401 or in a direction opposite which the first light emitting device is disposed.

The light emitting device 100 is a device having a light emitting diode (LED), and may include a package in which an LED chip is packaged. The light emitting chip 71 may emit at least one of blue, red, green, ultraviolet (UV), and infrared rays. The light emitting device 100 may emit at least one of white, blue, red, green, and infrared rays. The light emitting device 100 may be of a side view type in which a bottom portion is electrically connected to the substrate 401. As another example, the light emitting device 100 may be an LED chip, and may emit light in the direction of each side of the LED chip. The emission surface 81 of the light emitting device 100 may be disposed on at least one side surface of the light emitting device 100, not on the upper surface of the light emitting device 100. The emission surface 81 may be a surface adjacent to the substrate 401 among side surfaces of the light emitting device 100, for example, a side surface adjacent to the upper surface of the substrate 401. The emission surface 81 is disposed on a side surface between the bottom surface and the upper surface of the light emitting device 100, and emits light having the highest intensity in the first direction. The emission surface 81 of the light emitting device 100 may be a surface adjacent to the reflective member 410, or may be a surface perpendicular to the upper surface of the substrate 401 and the upper surface of the reflective member 410.

The light emitted through the emission surface 81 of the light emitting device 100 may proceed in a direction parallel to the upper surface of the substrate 401, is reflected by the reflective member 410, or may proceed toward the upper surface of the resin layer 420. The thickness of the light emitting device 100 may be, for example, 3 mm or less, for example, in the range of 0.8 mm to 2 mm. The length (D1 in FIG. 2) of the light emitting device 100 in the second direction may be 1.5 times or more of the thickness of the light emitting device 100. The light emitting device 100 may have a wider light directivity angle in the ±Y direction than the light directivity angle in the ±Z direction. The light directivity angle of the light emitting device 100 in the second direction may be 110 degrees or more, for example, 120 degrees to 160 degrees, or 140 degrees or more. The light directivity angle of the light emitting device 100 in the third direction may be 110 degrees or more, for example, in a range of 120 degrees to 140 degrees.

Reflective Member 410

Referring to FIGS. 1 to 4, the reflective member 410 may be disposed between the substrate 401 and the resin layer 420. The reflective member 410 may be adhered to the upper surface of the substrate 401. The reflective member 410 may have an area smaller than the upper surface area of the substrate 401. The reflective member 410 may be provided in the form of a film having a metallic material or a non-metallic material. The reflective member 410 may be spaced apart from the edge of the substrate 401, and a part of the resin layer 420 may be attached to the substrate 401 in a region spaced apart from the edge of the reflective member 410. Since the edge portion of the reflective member 410 may be attached to the resin layer 420, it is possible to prevent the edge portion of the resin layer 420 from peeling off. The reflective member 410 may include an opening 417 in which the lower portion of the light emitting device 100 is disposed. In the opening 417 of the reflective member 410, a portion to which the upper surface of the substrate 401 is exposed and the lower portion of the light emitting device 100 is bonded may be disposed. The size of the opening 417 may be equal to or larger than the size of the light emitting device 100. The reflective member 410 may be in contact with the upper surface of the substrate 401 or may be bonded between the resin layer 420 and the substrate 401. Here, the reflective member 410 may be removed when a highly reflective material is coated on the upper surface of the substrate 401.

The reflective member 410 may be formed to have a thickness thinner than that of the light emitting device 100. The thickness of the reflective member 410 may include a range of 0.2 mm±0.02 mm. The lower portion of the light emitting device 100 may pass through the opening 417 of the reflective member 410 and the upper portion of the light emitting device 100 may protrude. The emission surface 81 of the light emitting device 100 may be provided in a direction perpendicular to the upper surface of the reflective member 410.

The reflective member 410 may include a metallic material or a non-metallic material. The metallic material may include metals such as aluminum, silver, and gold. The non-metallic material may include a plastic material or a resin material. The plastic material may be any one selected form the group consisting of polyethylene, polypropylene, polystyrene, polyvinyl chloride, polychloride biphenyl, polyethylene terephthalate, polyvinyl alcohol, polycarbonate, polybutylene terephthalate, polyethylene naphthalate, polyamide, polyacetal, polyphenylene ether, polyamideimide, polyetherimide, polyetheretherketone, polyimide, polytetrafluoroethylene, liquid crystal polymer, fluororesin, copolymers thereof, and mixtures thereof. As the resin material, a reflective material such as TiO2, Al2O3, or SiO2 may be added to silicon or epoxy. The reflective member 410 may be implemented as a single layer or multiple layers, and light reflection efficiency may be improved by such a layer structure. The reflective member 410 according to an exemplary embodiment of the invention reflects incident light, thereby increasing the amount of light so that the light is uniformly distributed.

Referring to FIG. 5, the reflective member 410 may be arranged in a multilayer structure. The reflective member 410 may include an adhesive layer L1, a reflective layer L2, and a dot layer L3. The adhesive layer L1 may attach the reflective member 410 to the upper surface of the substrate 401. The adhesive layer L1 is a transparent material, and may be an adhesive such as UV adhesive, silicone, or epoxy. The reflective layer L2 may include a plurality of reflectors La in a resin material. The reflector La may be a bubble such as air or a medium having a refractive index of the same medium as air. The resin material of the reflective layer L2 is a material such as silicon or epoxy, and the reflector La may be formed by injecting bubbles into the resin material. The reflective layer L2 may reflect light incident by the plurality of reflectors La or may refract it in different directions. The thickness of the reflective layer L2 may be 80% or more of the thickness of the reflective member 410. The dot layer L3 in which a plurality of dots are arranged on the reflective layer L2 may be included. The dot layer L3 may be formed on the reflective layer L2 through printing. The dot layer L3 may include reflective ink. The dot layer L3 may be printed with a material including any one of $TiO_2$, $CaCO_3$, $BaSO_4$, $Al_2O_3$, Silicon, and PS. Each dot of the dot layer L3 may have a hemispherical shape or a polygonal shape in a side cross section. The density of the dot pattern of the dot layer L3 may increase as the distance from the emission surface 81 of the light emitting device 100 increases. The material of the dot layer L3 may be white. Since the dot layer L3 is disposed on the upper surface of the reflective member 410 in the emission direction of the light emitting device 100, light reflectance may be improved, light loss may be reduced, and brightness of a surface light source may be improved.

Referring to FIGS. 1, 2, and 6, the reflective member 410 may include a plurality of open regions 411 and 413. The plurality of open regions 411 and 413 include a plurality of first and second open regions 411 and 413 spaced apart from each other. The plurality of first open regions 411 may be arranged in the first direction, and the plurality of second open regions 413 may be arranged in the first direction. The first and second open regions 411 and 413 may be spaced apart in the second direction. The first open region 411 may be adjacent to a first side surface S1 of the substrate 401, and the second open region 413 may be adjacent to a second side surface S2 of the substrate 401. The first open region 411 may be arranged along the first side surface S1 of the substrate 401, and the second open region 413 may be arranged along the second side surface S2 of the substrate 401.

Each of the first open regions 411 may overlap each of the second open regions 413 in the second direction. The first and second open regions 411 and 413 may not overlap the light emitting device 100 and the light emitting device 100 in the second direction. The first and second open regions 411 and 413 may not overlap with the light emitting device 100 in the first and second directions. The first and second open regions 411 and 413 and the opening 417 may not overlap in the second direction. Accordingly, since the first and second open regions 411 and 413 are not disposed on both sides of the opening 417 in the second direction in the reflective member 410, It is possible to prevent a decrease in adhesive force in the second direction in which the opening 417 is disposed. At least one or a portion of the first and second open regions 411 and 413 may overlap at least one of the light emitting devices 100 in the second direction. A distance between the plurality of first and second open regions 411 and 413 may be greater than a length of the first direction X of the light emitting device 100. Each of the first and second open regions 411 and 413 may have an elliptical shape having a long shape in the first direction, a circular shape, or a polygonal shape. Each of the first and second open regions 411 and 413 may have an interval B4 in a first direction smaller than a length B5 of the first and second open regions 411 and 413 in the first direction. Here, it has a relationship of B5>B4, and a difference between the distance B4 and the length B5 may range from 0.1 mm to 1 mm. Since the length B5 of each of the first and second open regions 411 and 413 of the reflective member 410 are long in the first direction, it is possible to prevent a decrease in adhesive force of the region adjacent to the edge of the long side of the substrate 401. That is, it is possible to prevent a decrease in adhesive force of the reflective member 410 disposed between the first side surface S1 of the substrate 401 and the first open region 411 and between the second side surface S2 of the substrate 401 and the second open region 413.

Referring to FIGS. 2 and 4, an interval C2 between the first and second open regions 411 and 413 may be greater than a length D1 in the second direction of the light emitting device 100, and may be 1.5 times or more the length D1. Each of the first and second open regions 411 and 413 may have a width B6 in the second direction of less than ⅕ of the length B5, for example, in a range of ⅕ to 1/10. The width B6 may be 1.2 mm or less, for example, in the range of 0.8 mm to 1.2 mm. Each of the first and second open regions 411 and 413 may prevent a decrease in adhesive force in the second direction rather than in the first direction. The first open region 411 may be spaced apart from the first side surface S1 of the substrate 401 with a predetermined interval B2, and the second open region 413 may be spaced apart from the second side surface of the substrate 401 with a predetermined interval B2. The interval B2 may be 1.2 mm or less, for example, in the range of 0.5 mm to 1.2 mm. When the interval B2 is smaller than the above range, the adhesive force of the reflective member 410 disposed outside the first and second open regions 411 and 413 may be reduced, and when it is larger than the above range, the reflective area may be reduced. The reflective member 410 may be disposed outside the first and second open regions 411 and 413 and exposed on the first and second side surfaces S1 and S2 of the substrate 401. The resin layer 420 may be disposed on the first and second open regions 411 and 413 and the reflective member 410. The resin layer 420 may be adhered to the upper surface of the substrate 401 through the first and second open regions 411 and 413 to fix the outer portion of the reflective member 410.

Resin Layer 420

The resin layer 420 may be disposed on the substrate 401. The resin layer 420 may face the substrate 401. The resin layer 420 may be disposed on the entire upper surface or a partial region of the substrate 401. The lower surface area of the resin layer 420 may be equal to or smaller than the upper surface area of the substrate 401. The resin layer 420 may be formed of a transparent material. The resin layer 420 may include a resin material such as silicone or epoxy. The resin layer 420 may include a thermosetting resin material, and may optionally include, for example, PC, OPS, PMMA, PVC, or the like. The resin layer 420 may be formed of glass, but is not limited thereto. For example, as the main material of the resin layer 420, a resin material containing urethane acrylate oligomer as a main material may be used. For example, a mixture of a synthetic oligomer, urethane acrylate oligomer, and a polyacrylic polymer type may be used. Of course, it may further include a monomer in which a low-boiling-point dilution-type reactive monomer such as IBOA (isobornyl acrylate), HPA (Hydroxylpropyl acrylate, 2-HEA (2-hydroxyethyl acrylate), etc.) may be further included, and a photo initiator (such as 1-hydroxy cyclohexyl phenyl-ketone, etc.) or antioxidants can be mixed.

Since the resin layer 420 is provided as a layer for guiding light with resin, it may be provided with a thinner thickness than that of glass and may be provided as a flexible plate. The resin layer 420 may emit a point light source emitted from the light emitting device 100 in the form of a line light source or a surface light source. A bead (not shown) may be included in the resin layer 420, and the bead diffuses and reflects incident light, thereby increasing an amount of light. The beads may be disposed in a range of 0.01 to 0.3% based on the weight of the resin layer 420. The bead may be composed of any one selected from silicon, silica, glass bubble, PMMA (Polymethyl methacrylate), urethane (Urethane), Zn, Zr, $Al_2O_3$, or acrylic (Acryl), and a particle diameter of the beads may be in the range of about 1 μm to about 20 μm, but is not limited thereto.

Since the resin layer 420 is disposed on the light emitting device 100, it is possible to protect the light emitting device 100 and reduce loss of light emitted from the light emitting device 100. The light emitting device 100 may be embedded in a lower portion of the resin layer 420. The resin layer 420 may contact the surface of the light emitting device 100 and may contact the emission surface 81 of the light emitting device 100. A portion of the resin layer 420 may be disposed in the opening 417 of the reflective member 410. A portion of the resin layer 420 may contact the upper surface of the substrate 401 through the opening 417 of the reflective member 410. Accordingly, a part of the resin layer 420 is in contact with the substrate 401, so that the reflective member 410 may be fixed between the resin layer 420 and the substrate 401.

The resin layer 420 may include a first protrusion 421 disposed in the first open region 411 and a second protrusion 423 disposed in the second open region 413. The first protrusion 421 may be attached to the upper surface of the substrate 401 along the first open region 411. The first protrusion 421 may be disposed in the first open region 411 to prevent a decrease in adhesive force on an outer region of the reflective member 410 adjacent to the first side surface S1 of the substrate 401. The second protrusion 423 may be attached to the upper surface of the substrate 401 along the second open region 413. The second protrusion 423 is disposed in the second open region 413 of the reflective member 410 and may prevent a decrease in adhesive force on the outer area of the reflective member 410 adjacent to the second side surface S2 of the substrate 401. The first protrusions 421 are arranged in a first direction, the second protrusions 423 are arranged in the first direction, and the first and second protrusions 421 and 423 may be spaced apart from each other in the second direction. have. The first protrusion 421 and the second protrusion 423 may protrude lower than the upper surface of the reflective member 410. The first protrusion 421 and the second protrusion 423 may protrude toward a lower surface of the substrate 401. The first protrusion 421 and the second protrusion 423 may prevent a problem that the edge region of the reflective member 410 is lifted, and may be disposed in a bezel region of a housing to which the lighting module is coupled.

Referring to FIGS. 2 and 4, the thickness Z1 of the resin layer 420 may be 1.8 mm or more, for example, in the range of 1.8 to 2.5 mm. When the thickness Z1 of the resin layer 420 is thicker than the above range, the luminous intensity may decrease, and it may be difficult to provide a flexible module due to an increase in the module thickness. When the thickness Z1 of the resin layer 420 is smaller than the above range, it is difficult to provide a surface light source having a uniform light intensity. The length of the resin layer 420 in the first direction may be the same as the length of the substrate 401 in the first direction, and the width of the resin layer 420 in the second direction may be the same as the width Y1 of the substrate 401. Accordingly, each side surface of the resin layer 420 may be disposed on the same plane as each side surface of the substrate 401. For example, the first and second side surfaces S1 and S2 of the substrate 401 may be disposed on a vertical surface such as both side surfaces of the resin layer 420. The resin layer 420 may have a size covering the plurality of light emitting devices 100 or may be connected to each other. The resin layer 420 may be separated into a size covering each light emitting device 100, and may be separated into light emitting cells having each light emitting device 100/each resin layer 420. The upper surface of the resin layer 420 may have a first adhesive force. The upper surface of the resin layer 420 may have a first adhesive force and may be adhered to the diffusion layer 430. The resin layer 420 may have an upper surface recessed lower than the upper surface of the resin layer 420, or may include a stepped structure or a concave recess region on the upper surface. The stepped structure or concave recessed region of the resin layer 420 may function as a light-blocking portion 425. The resin layer 420 may include the light-blocking portion 425. The light-blocking portions 425 may be the same as the number of the light emitting devices 100. The light-blocking portion 425 may be provided on each of the light emitting devices 100 to have a size or area that is capable of preventing hot spots caused by light emitted in the emission direction of the light emitting devices 100. In addition, since the light emitting device 100 emits light in the side direction, that is, the first direction, the light-blocking portion 425 may cover a region in which a light-blocking efficiency of the light emitting device 100 may be increased due to the light directivity distribution and light reflection characteristics.

Light-Blocking Portion 425

Referring to FIGS. 1 to 3, the light-blocking portion 425 may face an upper surface of the substrate 401. The light-blocking portion 425 may overlap the light emitting device 100 in a vertical direction. Each of the plurality of light-blocking portions 425 may overlap each of the plurality of light emitting devices 100 in a vertical direction. The interval B1 between the light-blocking portions 425 may be smaller than the interval X1 between the light emitting devices 100. The light-blocking portion 425 may be spaced apart from the side surface of the resin layer 420. The plurality of the light-blocking portions 425 may be arranged in the first direction. The plurality of light-blocking portions 425 may have the same shape. The light-blocking portions may be divided into a first light-blocking portion on the first light emitting device and a second light-blocking portion on the second light emitting device. The first and second light-blocking portions may be disposed above each of the first and second light emitting devices in an emission direction. Referring to FIGS. 2 to 4, the light-blocking portion 425 may be disposed lower than the upper surface S11 of the resin layer 420. The bottom surface S12 of the light-blocking portion 425 may be disposed closer to the light emitting device 100 than the upper surface S11 of the resin layer 420. The light-blocking portion 425 may be an air gap. The light-blocking portion 425 may be a material having a refractive index equal to that of air or a refractive index lower than that of the resin layer 420. The light-blocking portion 425 is a region recessed concavely on the upper surface of the resin layer 420, and the bottom surface S12 of the light-blocking portion 425 is an upper surface recessed lower than the upper surface of the resin layer 420 forming the light-blocking portion 425, may be disposed at a lower position a surface where the diffusion layer 430 and the resin layer 420 contact, and may have a lower adhesive strength than that of the upper surface of the resin layer 420.

The bottom surface S12 of the light-blocking portion 425 may have a second adhesive force lower than a first adhesive force of the resin layer 420. For example, the upper surface S11 of the resin layer 420 may have fine cilia and be adhered to the diffusion layer 430, and the fine cilia on the bottom of the light-blocking portion 425 may be completely removed by an etching process. Here, the fine cilia may be the same material as that of the resin layer 420 and may be a surface material of the resin layer 420. The surface roughness value of the bottom surface S12 of the light-blocking portion 425 may be lower than the surface roughness value of the upper surface S11 of the resin layer 420. The light-blocking portion 425 is formed to a depth lower than the upper surface S11 of the resin layer 420 by an etching process, so that the first adhesive force formed on the upper surface S11 of the resin layer 420 may be removed. Accordingly, the bottom surface S12 of the light-blocking portion 425 may be provided as a surface having little adhesive force. Accordingly, the reflection efficiency of the light incident on the bottom surface S12 of the light-blocking portion 425 may be increased due to a surface having no adhesive force. That is, since the light-blocking portion 425 has a surface etched by a dry etching process, an intrinsic first adhesive force of the resin layer 420 may be removed. The bottom surface S12 of the light-blocking portion 425 is provided as a flat plane and may be provided as a fully reflective surface. When the bottom surface S12 is not flat, there may be a problem in that light out of a critical angle among incident light leaks. The light-blocking portion 425 may be disposed in a hemispherical shape, an oval shape, or a circular shape with respect to the light emitting device 100. Here, in the light-blocking portion 425, the width C1 in the second direction of the region adjacent to the light emitting device 100 is small, gradually increases toward the center of the light-blocking portion 425, and a width (e.g., C3) on the center in the second direction may increases to the maximum. The width of the second direction may gradually decrease from the center of the light-blocking portion 425 toward a direction away from the light emitting device 100. The maximum width C3 in the second direction from the center of the light-blocking portion 425 may be the largest, and the width in the second direction gradually decreases from the center of the light-blocking portion 425 to the first direction. A region of the light-blocking portion 425 overlapping the light emitting device 100 in a vertical direction has a flat inner surface, and a width in the second direction may be greater than the length D1 in the second direction of the light emitting device 100.

Since the width D1 in the second direction of the flat inner side of the light-blocking portion 425 is disposed larger than the length D1 by 0.8 mm or more, the light-blocking portion 425 may cover the both sides of the light emitting device 100 and may prevent hot spots caused by light emitted from the light emitting device 100. The light-blocking portion 425 may include a first region g1 vertically overlapping with the light emitting device 100, a second region g2 extending in a first direction with respect to the light emitting device 100, a third region g3 extending from the second region g2 toward the first side surface S1 of the substrate 401 or the first side surface of the resin layer 420, and a fourth region g4 extending from the second region g2 toward the second side surface S2 of the substrate 401 or the second side surface of the resin layer 420. The third and fourth regions g3 and g4 may be regions on both sides of the first and second regions g1 and g2. The first and second regions g1 and g2 may be disposed between the third and fourth regions g3 and g4. The third and fourth regions g3 and g4 may extend from the first region g1 in a direction of a first side surface S1 and a second side surface S2 of the substrate 401.

Here, the first region g1 may be disposed at one end of the light-blocking portion 425 in the first direction, and the second region g2 may be disposed at the other end. In the second direction, a third region g3 may be disposed at one end of the light-blocking portion 425, and a fourth region g4 may be disposed at the other end of the light-blocking portion 425. The second to fourth regions g2 to g4 may be disposed in an upper peripheral region of the light emitting device 100. The second to fourth regions g2 to g4 may not overlap the light emitting device 100 in a vertical direction. The area of the first region g1 may be 50% or more of the upper surface area of the light emitting device 100. When the area of the first region g1 is smaller than the area, light may leak through or around the first region g1 and a hot spot may occur. The first region g1 may have a flat inner surface or a convex curved surface.

Since the light-blocking portion 425 of the resin layer 420 may be disposed on upper portion of an region and the emission region of each light emitting device 100, the hot spots of incident light may reduce. The second region g2 may be spaced apart from the light emitting device 100 by a maximum distance. The sum of the areas of the first and second regions g1 and g2 may be greater than the area of the third region g3 or the area of the fourth region g4. The area of the second region g2 may be larger than the area of the third region g3 or the area of the fourth region g4. Accordingly, the light-blocking area in the second region g2 may be the largest and may be larger than the light-blocking area in the third and fourth regions g3 and g4. The outer portion of the second region g2 may include a convex curved surface. An outer portion of the second region g2 may be formed in a convex curved surface in the emission direction of the light emitting device 100 from the center of the light-blocking portion 425. The distance between the outer portion of the second region g2 and the first region g1 may be the farthest on the center part and gradually decrease toward the side part. A distance between the center part of the light-blocking portion 425 and the outer portion of the second region g2 may be the largest at the center part and the smallest at the side part. Here, the center part may be disposed on the same straight line as the center part of the light-blocking portion 425. The side part may be an area bordered by an outer portion of the third region g3 and the fourth region g4. The outer portion of the third region g3 may include the convex curved surface. The outer portion of the third region g3 may include a curved surface convex in a lateral direction of the resin layer 420 adjacent to the first side surface S1 of the substrate 401 from the center part of the light-blocking portion 425. The outer portion of the fourth region g4 may include the convex curved surface. An outer portion of the fourth region g4 may include a curved surface convex in a lateral direction of the resin layer 420 adjacent to the second side surface S2 of the substrate 401 from the center part of the light-blocking portion 425. The outer portion of the third region g3 is the most convex at the center part, may be connected to the outer portion of the first region g1 by a convex curved surface, and may be connected to the outer portion of the second region g2 by a convex curved surface. The outer portion of the fourth region g4 is the most convex at the center part, and may be connected to the outer portion of the first region g1 by a convex curved surface, may be connected to the outer portion of the second region g2 by a convex curved surface. The distance between the outer portion of the third region g3 and the outer portion of the fourth region g4 is the largest distance between the center parts passing through the center of the light-blocking portion 425, and the distance gradually decreases toward the side part. The third region g3 of the light-blocking portion 425 may overlap any one of the first open regions 411 in a vertical direction. The fourth region g4 of the light-blocking portion 425 may overlap any one of the second open regions 413 in a vertical direction. The third region g3 of the light-blocking portion 425 may overlap any one of the first protrusions 421 in a vertical direction. The fourth region g4 of the light-blocking portion 425 may overlap any one of the second protrusions 423 in a vertical direction. Among the first and second protrusions 421 and 423, protrusions overlapping the light-blocking portion 425 in a vertical direction may be adjacent to both sides of the emission surface 81 of the light emitting device 100.

The light-blocking portion 425 may have a maximum length B3 in the first direction equal to or smaller than the maximum width C3 in the second direction. The maximum width C3 may be 13 mm or more, for example, in the range of 13 mm to 17 mm. The maximum width C3 of the light-blocking portion 425 in the second direction may vary according to the length of the light emitting device 100 in the second direction. The maximum width C3 of the light-blocking portion 425 in the second direction may be disposed in a range of 50% or more, for example, 50% to 90% of the length Y1 of the substrate 401 in the second direction. The maximum length B3 in the first direction of the light-blocking portion 425 may be in the range of 0.3 times or more, for example, 0.3 times to 0.52 times the interval between the light emitting devices 100 (X1 in FIG. 1). The maximum length B3 in the first direction of the light-blocking portion 425 may be disposed in a range of 6 times or more, for example, 6 times to 10 times the width D2 of the light emitting device 100 in the first direction. Here, the interval X1 between the light emitting devices 100 may be 25 mm or more, for example, in the range of 25 mm to 30 mm, and may vary according to the characteristics of the light emitting devices 100. The light-blocking portion 425 provides the maximum length B3 in the first direction passing through the center part of the light-blocking portion 425 and the maximum width C3 in the second direction in the above ranges, so that a hot spot on the light emitting device 100 may reduce and the light uniformity may improve. The center part of the light-blocking portion 425 may be disposed in a range of 4.5 mm or more, for example, 4.5 mm to 6.5 mm on a flat plane of the first region g1 overlapping the light emitting device 100.

The depth Z3 of the light-blocking portion 425 may be 0.1 times or less, for example, 0.05 to 0.1 times the thickness Z1 of the resin layer 420. The depth Z3 of the light-blocking portion 425 may be 100 µm or more, for example, in a range of 100 to 200 µm. When the depth Z3 of the light-blocking portion 425 is smaller than the above range, there is a limit to reducing the hot spot, and when it is larger than the above range, the light uniformity may decrease. The distance Z4 between the upper surface of the light emitting device 100 and the lower surface of the light-blocking portion 425 may be 0.4 mm or more, for example, in a range of 0.4 mm to 0.6 mm. The distance Z0 between the upper surface of the light emitting device 100 and the upper surface of the reflective member 410 may be 0.8 mm or more, for example, in a range of 0.8 mm to 1.4 mm.

Here, one end of the light-blocking portion 425 is vertically overlapped with the light emitting device 100, and the other end of the light-blocking portion 425 in the first direction may be disposed in a region outside the predetermined angle R1 with respect to a straight line horizontal to the upper surface of the light emitting device 100. The angle R1 may be less than 10 degrees, for example, in the range of 1 to 9 degrees or in the range of 1 to 3 degrees. When the other end of the light-blocking portion 425 is disposed at the angle R1, the light uniformity may be reduced, and when it is smaller than the above range, a hot spot may occur.

Accordingly, the light-blocking portion 425 may be disposed in a range of 80 degrees or more, for example, 80 to 88 degrees or 86 to 88 degrees from a straight line perpendicular from the light emitting device 100. The distance C4 between the light-blocking portion 425 and a straight line perpendicular to the surface opposite to the emission surface 81 of the light emitting device 100 may be less than ½ of the width D2 in the first direction of the light emitting device 100. When the distance C4 is greater than the above range, light leakage may occur. The light-blocking portion 425 may have a maximum distance from a first point perpendicular to the center of the light emitting device 100 to a point space apart by the maximum distance in the first direction, and a point spaced apart in the second direction may be the minimum distance. The outer shape of the straight line connecting the point of the maximum distance to the point of the minimum distance may be a hemispherical shape. The maximum distance in the first direction orthogonal to the center of the light-blocking portion 425 may be smaller than the maximum distance in the second direction. When viewed from a top view, the light-blocking portion 425 may have a circular shape excluding a region overlapping the light emitting device 100 in a vertical direction.

Diffusion Layer 430

The diffusion layer 430 may be disposed on the resin layer 420. The diffusion layer 430 may include an adhesive region adhered to an upper surface of the resin layer 420 and a non-adhesive region A11 on the light-blocking portion 425. The diffusion layer 430 may be adhered to the upper surface S11 of the resin layer 420 with a first adhesive force. For example, the upper surface S11 of the resin layer 420 may be adhered to the diffusion layer 430 by a first adhesive force having fine cilia. In this case, the diffusion layer 430 may be attached to the resin layer 420 by applying a predetermined pressure or pressure/heat. Since the diffusion layer 430 is adhered to the resin layer 420 by self-adhesive force without a separate adhesive, the process of separately attaching the adhesive can be reduced, and no adhesive harmful to the human body may be used, thereby reducing the process or the material waste. The diffusion layer 430 is adhered to the entire upper surface of the resin layer 420, and the non-adhesive region A11 faces the bottom of the light-blocking portion 425 and may be disposed on the light-blocking portion 425. The diffusion layer 430 diffuses the light emitted through the resin layer 420. In addition, when the light intensity of the diffusion layer 430 is high, a specific color may not be mixed, and thus the light may be diffused and mixed. The material of the diffusion layer 430 may be a light-transmitting material. The diffusion layer 430 may include at least one of a polyester (PET) film, a polymethyl methacrylate (PMMA) material, or a polycarbonate (PC). The diffusion layer 430 may be provided as a film made of a resin material such as silicone or epoxy. The diffusion layer 430 may include a single layer or multiple layers. The thickness Z2 of the diffusion layer 430 may be 25 μm or more, for example, in the range of 25 to 250 μm or in the range of 100 to 250 μm. The diffusion layer 430 may have the above thickness range and provide incident light as a uniform surface light source.

The diffusion layer 430 may include at least one or two or more of diffusion agents such as beads, a phosphor, and ink particles. The phosphor may include, for example, at least one of a red phosphor, an amber phosphor, a yellow phosphor, a green phosphor, or a white phosphor. The ink particles may include at least one of metal ink, UV ink, or curing ink. The size of the ink particles may be smaller than the size of the phosphor. The surface color of the ink particles may be any one of green, red, yellow, and blue. The ink types are PVC (poly vinyl chloride) ink, PC (polycarbonate) ink, ABS (acrylonitrile butadiene styrene copolymer) ink, UV resin ink, epoxy ink, silicone ink, PP (polypropylene) ink, water-based ink, plastic ink, PMMA. It can be selectively applied from (poly methyl methacrylate) ink and PS (polystyrene) ink. The ink particles may include at least one of metal ink, UV ink, or curing ink.

In an embodiment of the invention, a light-blocking portion 425 having a predetermined depth is provided on the resin layer 420 on the light emitting device 100, and the diffusion layer 430 is adhered to the resin layer 420 without a separate adhesive, thereby simplified the process and maximized the shading effect. In addition, it is possible to improve the light uniformity of the surface light source emitted from the lighting module. According to the embodiment of the invention, by providing the light-blocking portion 425 having a predetermined depth to the resin layer 420 as an air gap, it is possible to reduce the process of forming a light-blocking pattern or material consumption, and the light intensity through the total reflection using the air gap may be improved.

In addition, by forming the light-blocking portion 425 through an etching process without using a mold for injection with the resin layer 420, the surface adhesion of the resin layer 420 is used and a shading effect may be provided through the surface reflectance of the light-blocking portion 425.

FIGS. 7 to 10 are views for explaining a manufacturing process of a lighting module according to an embodiment of the invention.

Figure 7:
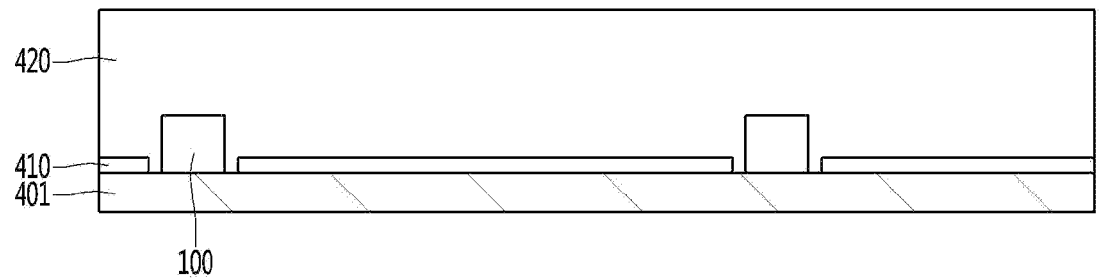
FIGS. 7 to 10 are views illustrating a manufacturing process of the lighting module of FIG. 1.

Referring to FIG. 7, a reflective member 410 having an opening 417 and an open region is attached on a substrate 401. The light emitting device 100 is adhered with a conductive adhesive member through the opening 417 of the substrate 401. Here, as shown in FIG. 5, the reflective member 410 may include an adhesive layer L1, a reflective layer L2 having bubbles, and a dot layer L3. A resin layer 420 is dispensed on the substrate 401 and the light emitting device 100. The resin layer 420 may include a transparent material such as silicone or epoxy. The resin layer 420 may protrude through the opening 417 and the open region of the substrate 401.

Figure 8:
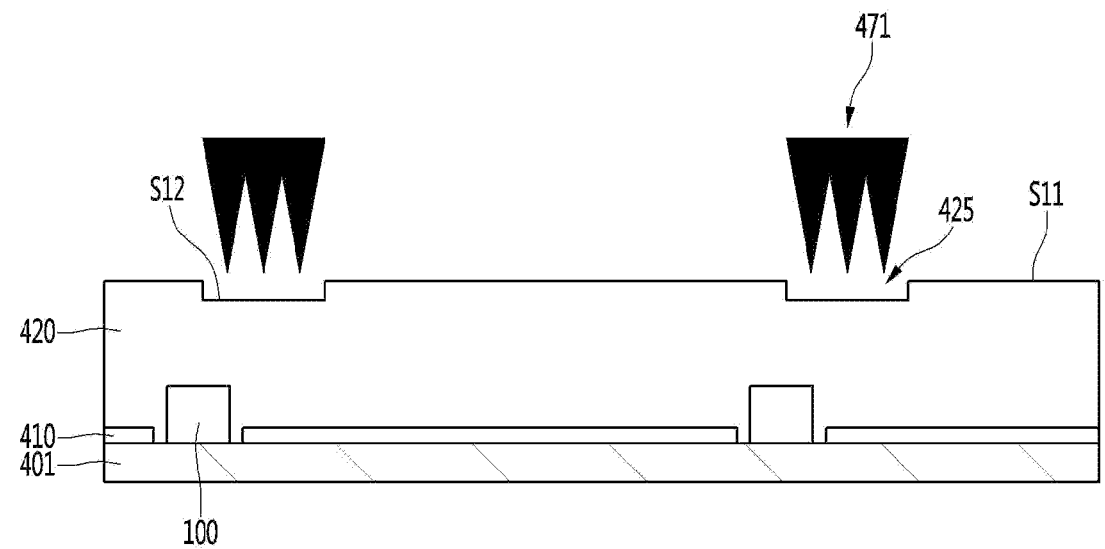

Referring to FIG. 8, when the resin layer 420 is formed, an etching equipment, for example, a laser 471 is irradiated from the upper surface of the resin layer 420. At this time, the laser is irradiated to a region of the light-blocking portion 425 disposed on the resin layer 420 and formed to a predetermined depth. At this time, the upper surface of the resin layer 420 is a surface on which the light-blocking portion 425 is not formed, and has self-adhesive properties, and the bottom of the light-blocking portion 425 is etched by the laser 471 as described above. Adhesive properties may be eliminated. By forming the light-blocking portion 425 through an etching process without using a mold for injection with the resin layer 420, the surface adhesion of the resin layer 420 is used and a shading effect may be provided through the surface reflectance of the light-blocking portion 425.

Figure 9:
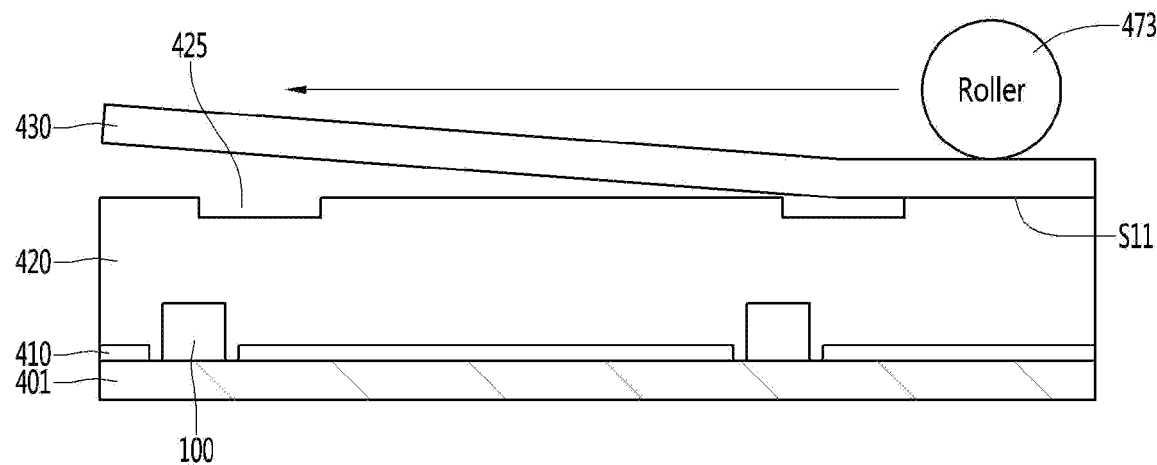
Figure 10:
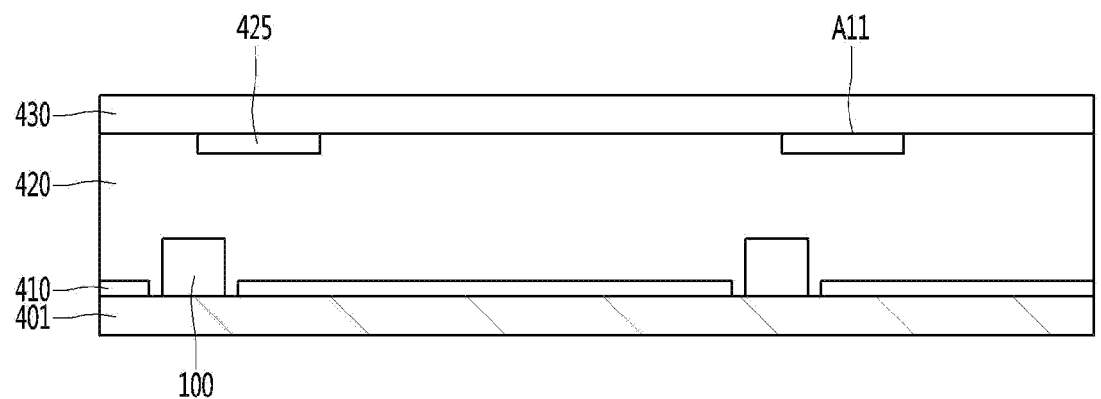

Referring to FIGS. 8 and 9, the diffusion layer 430 is pressed and attached to the upper surface of the resin layer 420 using a pressing equipment, for example, a roller 473. In this case, the diffusion layer 430 may be closely adhered to the upper surface of the resin layer 420 due to the adhesive property of the upper surface of the resin layer 420. Referring to FIG. 10, when the diffusion layer 430 is adhered on the resin layer 420, a lighting module may be provided. Such a lighting module may be provided in the size of a unit module. In addition, by cutting the rear side of the light emitting device, a plurality of light emitting cells having a resin layer/diffusion layer on each of the light emitting devices may be separated. In the manufacturing process of such a lighting module, a separate material may not be used for the light-blocking portion 425, and the diffusion layer 430 is adhered to the resin layer 420 due to the inherent surface adhesion properties of the resin layer 420, so that a separate adhesive may be not used. Therefore, since the light-blocking portion 425 and the adhesive are not used, manufacturing processes and materials may be reduced. For example, the upper surface S11 of the resin layer 420 may be adhered to the diffusion layer 430, and the bottom of the light-blocking portion 425 may be completely removed from the adhesive property by an etching process.

Figure 11:
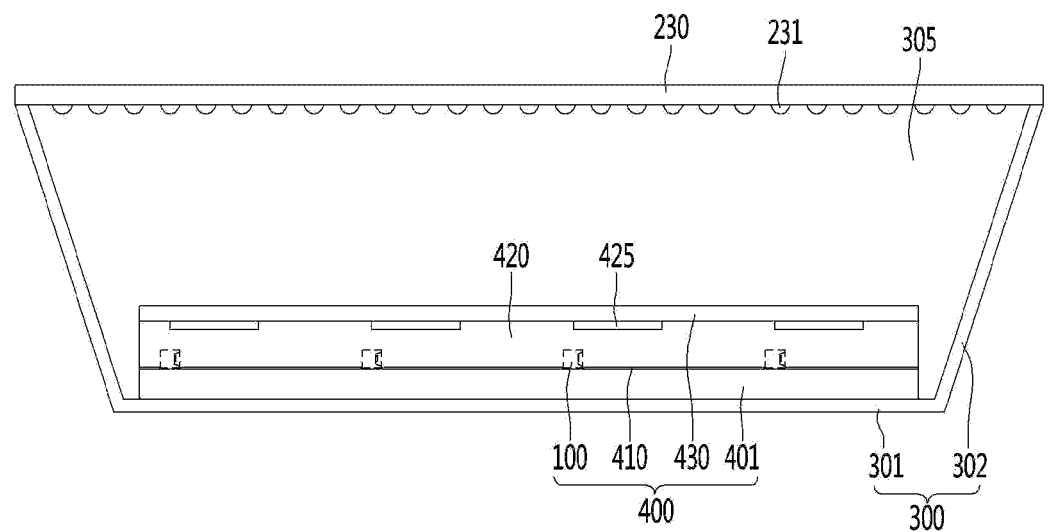
FIG. 11 is an example of a lighting device having the lighting module of FIG. 3.

FIG. 11 is a view showing a lighting device having a lighting module according to an embodiment. The lighting module in the lighting device according to the embodiment will be referred to the above description.

Referring to FIG. 11, the lighting module 400 includes the module disclosed in the embodiment, for example, and may include a substrate 401, a plurality of light emitting devices 100 on the substrate 401, a resin layer 420, a reflective member 410 and a diffusion layer 430. An optical member 230 may be disposed on the lighting module 400, and the optical member 230 may diffuse and transmit incident light. The optical member 230 uniformly diffuses the surface light source emitted through the diffusion layer 430 to emit light. The optical member 230 may include an optical lens or an inner lens, and the optical lens may condense light in a target direction or change a path of light. The optical member 230 includes a plurality of lens portions 231 on at least one of an upper surface and a lower surface, and the lens portion 231 may be a shape protruding downward or upward from the optical member 230. The optical member 230 may adjust light distribution characteristics of the lighting device.

The optical member 230 may include a material having a refractive index of 2.0 or less, for example, a material of 1.7 or less. The material of the optical member 230 may be formed of a transparent resin material such as acrylic, polymethyl methacrylate (PMMA), polycarbonate (PC), or epoxy resin (EP), or transparent glass. The optical member 230 may have an interval of 10 mm or more, such as 15 mm to 100 mm, with the lighting module 400, for example, the substrate 401. When the interval is out of the range, the luminous intensity may be lowered and when it is smaller than the above range, the uniformity of light may be reduced. The lighting module 400 may include a heat dissipation plate (not shown) on a bottom surface. The heat dissipation plate may include a plurality of heat dissipation fins, and may dissipate heat conducted to the substrate 401. The heat dissipation plate may include at least one of metals such as aluminum, copper, magnesium, and nickel, or a selective alloy thereof.

The lighting device includes a housing 300 having a receiving space 305, a lighting module according to an embodiment disposed on the bottom of the receiving space of the housing 300, and an optical member 230 disposed on the lighting module. do. In the housing 300, the outer side of the receiving space 305 may be provided as an inclined surface with respect to the bottom surface of the housing 300, and such an inclined surface may improve light extraction efficiency. The surface of the receiving space 305 of the housing 300 may be formed of a metallic material of a reflective material, and light extraction efficiency in the receiving space 305 may be improved by the metallic material. The depth of the receiving space 305 may be disposed larger than the high point of the resin layer 420, and light emitted through the resin layer 420 may be emitted.

The housing 300 includes a bottom portion 301 and a reflective portion 302, the bottom portion 301 is disposed under the substrate 401, the reflective portion 302 protrudes upward from the outer periphery of the bottom portion 301 and may be disposed around the resin layer 420. The housing 300 may include a metal or plastic material, but is not limited thereto. An opening (not shown) through which a cable connected to the substrate 401 passes may be formed in the bottom portion 301 or the reflective portion 302 of the housing 300, but the embodiment is not limited thereto. The substrate 401 may be adhered to the bottom portion 301 of the housing 300 with a fastening means such as a screw or an adhesive member, or may be coupled to a structure such as a hook. Accordingly, the substrate 401 may be fixed to the bottom portion of the housing 300. The reflective portion 302 may be a side part of the housing 300. The lighting device according to the embodiment may be applied to various vehicle lighting devices such as head lamps, vehicle width lights, side mirror lights, fog lights, tail lamps, stop lamps, and daytime running lights, display devices, and traffic lights.

FIG. 12 is a front view showing a light emitting device on a substrate in the lighting module according to the embodiment, and FIG. 13 is a side view of the light emitting device of FIG. 12.

Referring to FIGS. 12 and 13, the light emitting device 100 includes a body 10 having a cavity 20, a plurality of lead frames 30 and 40 in the cavity 20, and a light emitting chip 71 disposed on at least one of the plurality of lead frames 30 and 40. The light emitting device 100 may be implemented as a side-emitting type package. The body 10 may include a cavity 20 in which the lead frames 30 and 40 are exposed at the bottom thereof. The plurality of lead frames 30 and 40 are separated into, for example, a first lead frame 30 and a second lead frame 40 and are coupled to the body 10.

The body 10 may be formed of an insulating material. The body 10 may be formed of a reflective material. The body 10 may be formed of a material having a reflectance higher than transmittance, for example, a material having a reflectance of 70% or more with respect to the wavelength emitted from the light emitting chip. When the reflectance of the body 10 is 70% or more, the body 10 may be defined as a non-transmissive material or a reflective material. The body 10 may be formed of a resin-based insulating material, for example, a resin material such as Polyphthalamide (PPA). The body 10 may be formed of a silicone-based, epoxy-based, or thermosetting resin including a plastic material, or a material having high heat resistance and high light resistance. The body 10 includes a white resin. In the body 10, an acid anhydride, an antioxidant, a release material, a light reflecting material, an inorganic filler, a curing catalyst, a light stabilizer, a lubricant, and titanium dioxide may be selectively added. The body 10 may be molded by at least one selected from the group consisting of an epoxy resin, a modified epoxy resin, a silicone resin, a modified silicone resin, an acrylic resin, and a urethane resin. For example, a epoxy resin composition which is formed by adding an epoxy resin composed of triglycidyl isocyanurate, hydrogenated bisphenol A diglycidyl ether, etc. and an acid anhydride composed of hexahydrophthalic anhydride, 3-methylhexahydrophthalic anhydride, 4-methylhexahydrophthalic anhydride, etc. with 1,8-diazabicyclo (5,4,0) undecene-7 (DBU) as a curing agent, ethylene glycol as a co-catalyst, titanium oxide pigment, and glass fiber in the epoxy resin, partially curing by heating, and a solid epoxy resin composition obtained by curing and forming B staging may be used, and the present invention is not limited thereto. The body 10 may be suitably mixed with at least one selected from the group consisting of a diffusing agent, a pigment, a fluorescent material, a reflective material, a light-blocking material, a light stabilizer, and a lubricant. The body 10 may include a reflective material, for example, a resin material to which a metal oxide is added, and the metal oxide may include at least one of TiO2, SiO2, and Al2O3. This body 10 may effectively reflect incident light. As another example, the body 10 may be formed of a light-transmitting resin material or a resin material having a phosphor that converts the wavelength of incident light. The bottom of the body 10 may be a side surface corresponding to the substrate 401.

The first lead frame 30 includes a first lead portion 31 disposed on the bottom of the cavity 20, a first bonding portion 32 and a first heat dissipating portion 33 extending outside the body 10. The first bonding portion 32 is bent from the first lead portion 31 in the body 10 and protrudes outside the body, and the first heat dissipating portion 33 may be bent from the first bonding portion 32. The second lead frame 40 includes a second lead portion 41 disposed at the bottom of the cavity 20, a second bonding portion 42 and a second heat dissipating portion 43 disposed outside the body 10. The second bonding portion 42 may be bent from the second lead part 41 in the body 10, and the second heat dissipating portion 43 may be bent from the second bonding portion 42. Here, the light emitting chip 71 may be disposed on the first lead portion 31 of the first lead frame 30, for example, and connected to the first and second lead portions 31 and 41 by wire, or may be connected with the first lead portion 31 and may be connected to the second lead portion 41 by a wire. The light emitting chip 71 may be a horizontal type chip, a vertical type chip, or a chip having a via structure. The light emitting chip 71 may be mounted in a flip chip manner. The light emitting chip 71 may selectively emit light within a wavelength range of ultraviolet to visible light. The light emitting chip 71 may emit light with an ultraviolet or blue peak wavelength, for example. The light emitting chip 71 may include at least one of a group II-VI compounds and a group III-V compounds. The light emitting chip 71 may be formed of, for example, a compound selected from the group consisting of GaN, AlGaN, InGaN, AlInGaN, GaP, AlN, GaAs, AlGaAs, InP, and mixtures thereof.

One or more light emitting chips 71 may be disposed in the cavity 20 and emit light having the greatest intensity in the direction of the central axis Y0. One or a plurality of light emitting chips disposed in the cavity 20 of the light emitting device 100 according to the embodiment may be disposed. The light emitting chip may be selected from, for example, a red LED chip, a blue LED chip, a green LED chip, and a yellow green LED chip. A molding member 80 is disposed in the cavity 20 of the body 11, and the molding member 80 includes a light-transmitting resin such as silicone or epoxy, and may be formed in a single layer or multiple layers. A phosphor for changing a wavelength of light emitted from the molding member 80 or the light emitting chip 71 may be included, and the phosphor excites a part of light emitted from the light emitting chip 71 and is emitted as light to have a different wavelength. The phosphor may be selectively formed from quantum dots, YAG, TAG, Silicate, Nitride, and Oxy-nitride-based materials. The phosphor may include at least one of a red phosphor, a yellow phosphor, and a green phosphor, but is not limited thereto. The emission surface 81 of the molding member 80 may be formed in a flat shape, a concave shape, a convex shape, and the like, but is not limited thereto. As another example, a light-transmitting film having a phosphor may be disposed on the cavity 20, but the embodiment is not limited thereto.

A lens may be further formed on the upper portion of the body 10, and the lens may have a concave or/and convex lens structure, and may control light distribution of light emitted by the light emitting device 100. A semiconductor device such as a light receiving device and a protection device may be mounted on the body 10 or any one lead frame, and the protection device may be implemented as a thyristor, a Zener diode, or a TVS (transient voltage suppression). The Zener diode protects the light emitting chip from electro static discharge (ESD). At least one or a plurality of light emitting devices 100 are disposed on the substrate 401, and a reflective member 410 is disposed around a lower periphery of the light emitting device 100. The first and second lead portions 33 and 43 of the light emitting device 100 are bonded to the pads 403 and 405 of the substrate 401 with solder or conductive tape, which are conductive adhesive members 203 and 205.

Figure 14:
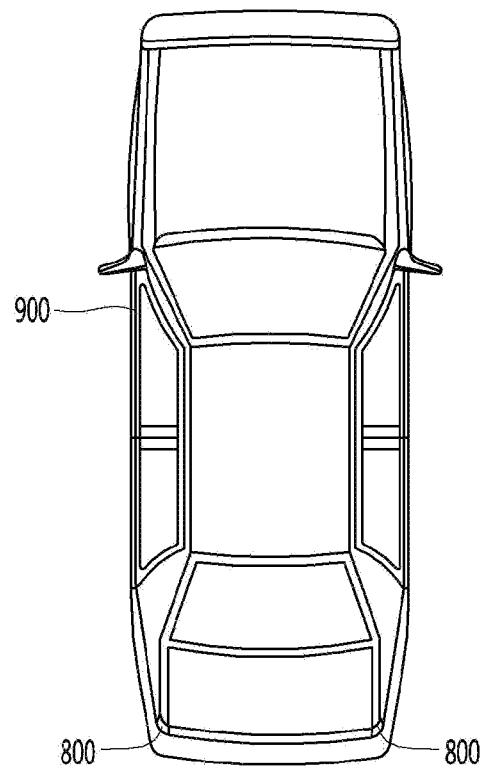
FIG. 14 is a view showing a lamp having a lighting module or a lighting device according to an embodiment.
Figure 14:
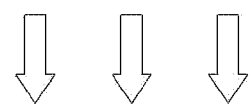
Figure 15:
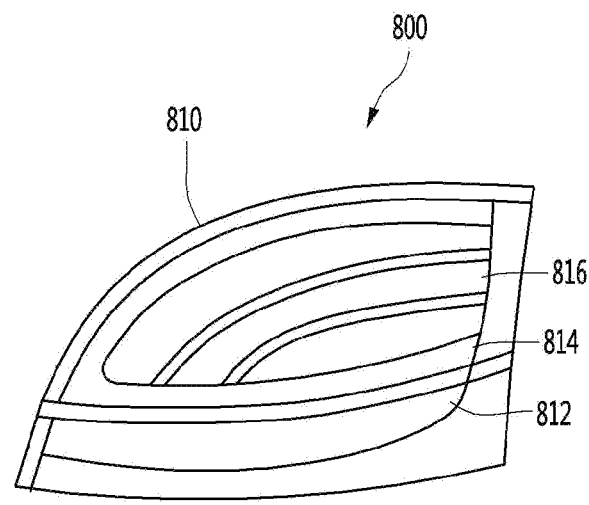
FIG. 15 is a plan view of a vehicle to which the vehicle lamp of FIG. 14 is applied.

FIG. 14 is a view showing a vehicle lamp having a lighting module or lighting device according to an embodiment, and FIG. 15 is a plan view of a vehicle to which the vehicle lamp of FIG. 14 is applied.

Referring to FIGS. 14 and 15, the rear light 800 in the vehicle 900 may include a first lamp unit 812, a second lamp unit 814, a third lamp unit 816, and a housing 810. Here, the first lamp unit 812 may be a light source for the role of a direction indicator, the second lamp unit 814 may be a light source for the role of a vehicle width lamp, and the third lamp unit 816 may be a light source for the role of a brake light. The housing 810 accommodates the first to third lamp units 812, 814, and 816, and may be made of a light-transmitting material. In this case, the housing 810 may have a bend according to the design of the vehicle body, and the first to third lamp units 812, 814, and 816 may implement a surface light source that may have a curved surface according to the shape of the housing 810. As shown in FIG. 15, when the lamp unit is applied to a tail lamp, a brake lamp, or a turn signal lamp of a vehicle, it may be applied to a turn signal lamp of a vehicle. Here, as for the safety standard of the vehicle lamp, when measured based on the front light, the tail light has a light distribution standard in a range of 4 to 5 candela (cd), and the brake light has a light distribution standard in a range of 60 to 80 candela (cd). As shown in FIGS. 15 and 16, the lighting module according to the embodiment is distributed with a luminous intensity having a candela of 50 or more, and thus, a luminous intensity within the vehicle safety standard of a lamp such as a brake light or a tail light may be provided.

Features, structures, effects, and the like described in the embodiments above are included in at least one embodiment of the invention, and are not necessarily limited to only one embodiment. Furthermore, the features, structures, effects, and the like illustrated in each embodiment may be combined or modified for other embodiments by a person having ordinary knowledge in the field to which the embodiments belong. Accordingly, contents related to such combinations and modifications should be construed as being included in the scope of the invention. In addition, although the examples have been described above, these are only examples and do not limit the invention, and those of ordinary skill in the field to which the invention pertains are illustrated above within the scope not departing from the essential characteristics of the present embodiment. It will be seen that various modifications and applications that have not been made are possible. For example, each component specifically shown in the embodiment can be modified and implemented. And differences related to these modifications and applications should be construed as being included in the scope of the invention defined in the appended claims.

The invention claimed is:

1. A lighting module comprising:
   a substrate;
   a reflective member disposed on the substrate;
   a plurality of light emitting devices disposed on the substrate;
   a resin layer disposed on the reflective member and the light emitting devices; and
   a diffusion layer disposed on the resin layer,
   wherein the resin layer includes a plurality of light-blocking portions that are a recess region formed concave from an upper surface of the resin layer,
   wherein each of the light emitting devices emits light in a first direction,
   wherein each of the plurality of light-blocking portions includes a first region overlapping the light emitting device, a second region extending from the first region in the first direction, a third region extending from the second region in a direction of a first side surface of the substrate, and a fourth region extending from the second region in a direction of a second side surface of the substrate, wherein a maximum length of each of the light-blocking portions in the first direction is less than a maximum width in a second direction orthogonal to the first direction,
   wherein an area of the second region is larger than an area of the third region or an area of the fourth region,
   wherein each of the light-blocking portions is formed by an air gap.

2. The lighting module of claim 1, wherein the second, third, and fourth regions of each of the light-blocking portions include curved surfaces that are convex in an outward direction.

3. The lighting module of claim 2, wherein an area of the first region is ½ or more of an area of an upper surface of each of the light emitting devices,
   wherein each of the light emitting devices includes an emission surface that emits light in the first direction,
   wherein the emission surface is disposed perpendicular to an upper surface of the substrate.

4. The lighting module of claim 3, wherein the plurality of the light emitting devices are disposed on the substrate in the first direction,
   wherein the light-blocking portions are disposed on the resin layer in the first direction.

5. The lighting module of claim 3, wherein an inner side surface of the resin layer forming each of the light-blocking portions is flat and overlaps each of the light emitting devices in a vertical direction, and
   wherein a width in the second direction of a flat inner side surface of the resin layer is greater than a width in the second direction of each of the light emitting devices.

6. The lighting module of claim 1,
   wherein a bottom surface of the resin layer forming each of the light-blocking portions is flat,
   wherein a depth of each of the light-blocking portions is in a range of 0.05 to 0.1 times a thickness of the resin layer.

7. The lighting module of claim 1,
   wherein each of the light-blocking portion is disposed on the resin layer in a region deviating from a predetermined angle from a horizontal straight line on an upper surface of each of the light emitting devices,
   wherein the angle between the horizontal straight line on the upper surface of each of the light emitting devices and the other end of each of the light-blocking portions is less than 10 degrees.

8. The lighting module of claim 1,
   wherein the reflective member includes a plurality of first open regions disposed adjacent to the first side surface of the substrate, and a plurality of second open regions disposed adjacent to the second side surface of the substrate,
   wherein each of the plurality of first open regions and each of the second open regions is arranged in the first direction,
   wherein the resin layer includes protrusions disposed in each of the first open regions and each of the second open regions.

9. The lighting module of claim 8, wherein an interval between the first open region and the second open region in second direction orthogonal to the first direction is smaller than a maximum width of each of the light-blocking portions in the second direction,
   wherein each of the first open regions and each of the second open regions are arranged in the first direction and in the second direction so as not to overlap with each of the light emitting devices.

10. The lighting module of claim 9, wherein each of the light-blocking portions is vertically overlapped with one of the first open regions or one of the second open regions.

11. A lighting module comprising:
    a substrate;
    a reflective member disposed on the substrate;
    a light emitting device disposed on the substrate;
    a resin layer disposed on the reflective member and the light emitting device; and
    a diffusion layer disposed on the resin layer,
    wherein the light emitting device emits light in a first direction through a side surface between an upper surface and a bottom surface of the light emitting device,
    wherein the resin layer includes a light-blocking portion having a recess concave toward the substrate in a portion of an upper surface of the resin layer,
    wherein the light-blocking portion comprises a first region vertically overlapping the light emitting device, a second region extending from the first region in the first direction, and a third region and a fourth region convex toward both sides of the resin layer from the second region,
    wherein an area of the second region is larger than an area of the third region or an area of the fourth region,
    wherein the light-blocking portion has a maximum length in the first direction less than a maximum width in a second direction orthogonal to the first direction,
    wherein the light-blocking portion is formed with an air gap between the resin layer and the diffusion layer.

12. The lighting module of claim 11, wherein the second region, the third region, and the fourth region include curved surfaces that are convex outwardly from a center of the light-blocking portion, wherein the second region, the third region, and the fourth region are arranged so as not to overlap the light emitting device in a vertical direction.

13. The lighting module of claim 12, wherein an area of the first region is equal to or greater than ½ of an upper surface area of the light emitting device,
wherein a depth of the light-blocking portion is in a range of 0.05 to 0.1 times a thickness of the resin layer.

14. The lighting module of claim 13,
wherein a maximum width of the light-blocking portion in the second direction is in a range of 13 mm to 17 mm,
wherein a maximum length of the light-blocking portion in the first direction is in a range of 0.3 times to 0.52 times an interval between two adjacent light emitting devices.

15. The lighting module of claim 13, wherein the first region is disposed at one end of the light-blocking portion in the first direction, and the second region is disposed at the other end,
wherein the third region is disposed at one end of the light-blocking portion in the second direction, and a fourth region is disposed at the other end,
wherein the second region, the third region and the fourth region do not overlap the light emitting device in the vertical direction.

16. The lighting module of claim 11,
wherein a bottom surface of the light-blocking portion is lower than the upper surface of the resin layer and is a flat plane,
wherein the first region has a flat inner side surface.

17. The lighting module of claim 11,
wherein a bottom surface of the light-blocking portion is flat,
wherein a surface roughness value of the bottom surface of the light-blocking portion is lower than a surface roughness value of the upper surface of the resin layer.

18. The lighting module of claim 11, wherein the light-blocking portion has a depth in a range of 100 μm to 200 μm,
wherein a distance between the upper surface of the light emitting device and a lower surface of the light-blocking portion is in a range of 0.4 mm to 0.6 mm.

19. The lighting module of claim 11,
wherein the light-blocking portion is disposed in a range of 80 degrees to 88 degrees from a straight line perpendicular to the light emitting device.

20. The lighting module of claim 11,
wherein the light-blocking portion has a circular top view shape excluding the first region.

* * * * *